TUNNEL DIODE BINARY CIRCUITS EMPLOYING SERIES CONNECTED TUNNEL DIODES AND TRANSFORMER COUPLING

Filed Dec. 2, 1963 4 Sheets-Sheet 1

INVENTOR.
MICHAEL MAY,
BY
Walter J. Adam
ATTORNEY

Nov. 29, 1966 M. MAY 3,289,011

TUNNEL DIODE BINARY CIRCUITS EMPLOYING SERIES CONNECTED TUNNEL DIODES AND TRANSFORMER COUPLING

Filed Dec. 2, 1963 4 Sheets-Sheet 2

INVENTOR.
MICHAEL MAY,
BY
Walter J. Adam
ATTORNEY.

Nov. 29, 1966 M. MAY 3,289,011

TUNNEL DIODE BINARY CIRCUITS EMPLOYING SERIES CONNECTED TUNNEL DIODES AND TRANSFORMER COUPLING

Filed Dec. 2, 1963 4 Sheets-Sheet 3

INVENTOR.
MICHAEL MAY,
BY
Walter J. Adam
ATTORNEY.

INVENTOR
MICHAEL MAY,
BY
Walter J. Adam
ATTORNEY.

United States Patent Office 3,289,011

Patented Nov. 29, 1966

3,289,011

TUNNEL DIODE BINARY CIRCUITS EMPLOYING SERIES CONNECTED TUNNEL DIODES AND TRANSFORMER COUPLING

Michael May, Los Angeles, Calif., assignor to Hughes Aircraft Company, Culver City, Calif., a corporation of Delaware Filed Dec. 2, 1963, Ser. No. 327,264
6 Claims. (Cl. 307—88.5)

This invention relates to high speed circuits utilizing negative resistance devices and particularly to an improved shift register and an improved binary counter including reliable and simplified storage elements.

A conventional counter and shift register circuit utilizes in the binary storage elements thereof, a pair of tunnel diodes and a voltage divider both coupled in parallel from a source of potential and load resistor to a source of reference potential. An inductor is coupled from a point in the voltage divider to a point between the two tunnel diodes, which latter point is coupled through a resistor to the input of the next stage. A point between the two series paths and the load resistor is conventionally utilized as the input terminal of the next stage. Because the output point at the junction of the tunnel diodes is sensitive to pulses or signals applied from the next stage such as in a counter, the coupling resistor is usually required to be connected in series with the coupling capacitor. The coupling resistor between stages is required to be relatively large resulting in substantial attenuation of the interstage pulses. Further, because of the arrangement of the load resistor, the interstage trigger pulses are applied thereacross when triggering the tunnel diodes resulting in further attenuation of the effective signal. Conventional circuits such as counters utilizing tunnel diodes do not have as wide a range of parameter variation as is desired for reliable operation, because they must be designed to be sensitive to the attenuation trigger pulses.

It is therefore an object of this invention to provide an improved storage element utilizing negative resistance devices and that has a substantially low output impedance which matches the input impedance of a similar storage element of a following stage.

It is a further object of this invention to provide tunnel diode storage element stages that may be capacitively intercoupled.

It is a still further object of this invention to provide a high speed and reliable counter circuit utilizing tunnel diodes with a minimum of circuit elements.

It is another object of this invention to provide a reliable and high speed shift register utilizing tunnel diodes and that selectively operates in a serial or parallel manner.

Briefly in accordance with the principles of this invention, an improved binary storage element includes a first and second parallel path coupled between a capacitive coupled input terminal and a source of reference potential with the first path including a pair of tunnel diodes and the second path including a voltage divider. Inductance for switching the states of the tunnel diodes is provided by a transformer arrangement having a first winding coupled from between the tunnel diodes to the voltage divider and having a second winding coupled to an output terminal to provide a desired output impedance and D.C. (direct current) isolation. The storage element is utilized in an improved and reliable high speed counter circuit and shift register circuit with the shift register selectively providing serial and parallel operation.

The novel features of this invention, as well as the invention itself, both as to its organization and method of operation, will best be understood from the accompanying description, taken in connection with the accompanying drawings, in which like reference characters refer to like parts, and in which.

Figure 1:
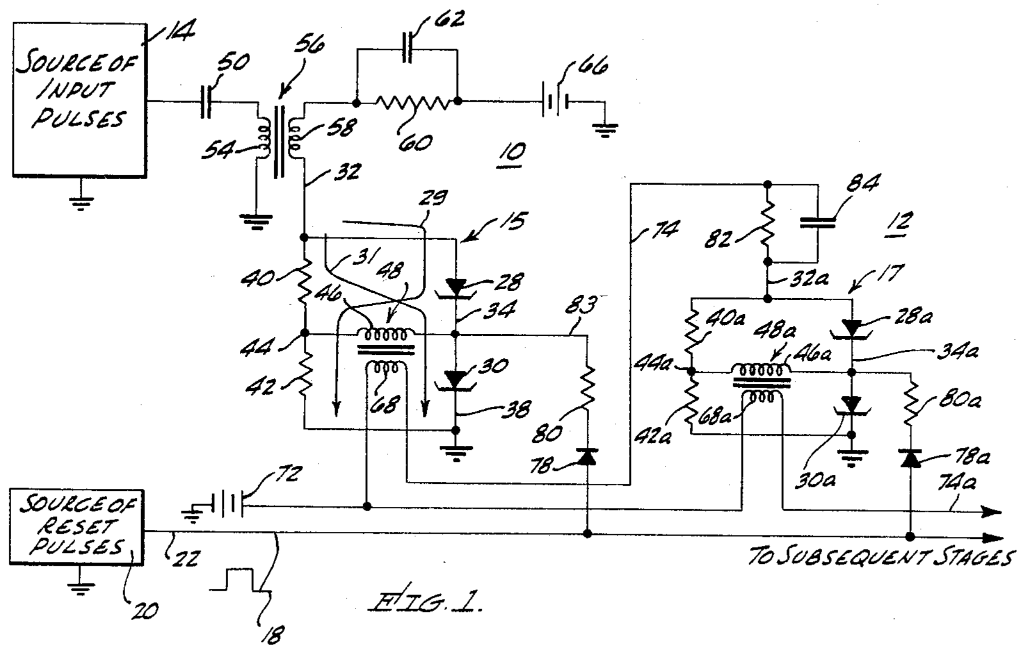
FIG. 1 is a schematic circuit and block diagram of an improved counter circuit and storage element in accordance with the principles of the invention.

Referring now to the counter circuit of FIG. 1, first and second stages 10 and 12 are shown as representative of a plurality of stages that may be utilized to respond to pulses applied to the first stage 10 from a source of input pulses 14, for example. In order to reset to zero the stages of the counter, a sufficiently wide positive pulse of a waveform 18 is applied simultaneously to each stage from a reset source 20 through a lead 22. The stages 10 and 12 include respective binary storage element 15 and 17, each responsive to positive pulses applied to the input therefor to the reset pulses of the waveform 18. The first stage 10 includes first and second negative resistance devices such as tunnel diodes 28 and 30 with the tunnel diode 28 having an anode coupled to a lead 32 and a cathode coupled to a lead 34. The anode of the tunnel diode 30 is coupled to the lead 34 and the cathode is coupled to a lead 38 which in turn is coupled to a suitable source of reference potential such as ground. The lead 32 is also coupled to the lead 38 through a suitable voltage divider arrangement including resistors 40 and 42 with a lead 44 coupled therebetween, the resistor providing reliable current control through the tunnel diodes. An inductive element such as a first winding 46 of a transformer 48 is coupled between the leads 44 and 34 for providing rapid triggering of the tunnel diodes as well as for providing a suitable impedance output arrangement in accordance with the invention.

Because the stage 10 is the first stage of the counter, pulses are applied thereto from the source of input pulses 14 through a suitable coupling capacitor 50 to a first winding 54 of a transformer 56, the winding 54 being referenced to ground. A second winding 58 of the transformer 56 has one end coupled to the lead 32 and the other end coupled through a parallel arranged resistor 60 and a capacitor 62 to a suitable source of B+ reference potential such as the positive terminal of a battery 66 which in turn has a negative terminal coupled to ground. It is to be noted at this time that the input or trigger signal of other stages such as 12 is applied to the bistable element 17 without signal attenuation by current flowing through a load resistor to a positive source of potential.

To provide a suitable output impedance to the bistable element 15, a winding 68 of the transformer 48 is provided with one end coupled to a suitable source of positive B+ potential such as the positive terminal of a battery 72 having a negative terminal coupled to ground. The other end of the winding 68 is coupled to an output lead 74 through which a trigger signal is applied to the second stage 12. The windings 46 and 68 of the transformer 48 may have a respective turns ratio of 2 to 1 for providing a desired low output impedance. Also, because of this turns ratio of the tranformer 48, transient signals applied to the winding 68 from the stage 12 have substantially no effect on the stored states of the storage element 15. It is also to be noted that the transformer 48 provides D.C. (direct current) isolation from the subsequent stage 12. The counter is reset to a "0" state by applying a sufficiently long pulse of the waveform 18 from the lead 22 through the anode to cathode path of a diode 78 and a resistor 80 to a lead 83 which in turn is coupled to the lead 34.

The second stage 12 which includes the bistable element 17 is similar to the first stage 10 except for the input arrangement. For simplicity of explanation, the elements of the second stage 12 which are similar to the elements of the first stage 10 are designated by reference numerals which are similar except including the subscript "*a*." The lead 74 is coupled to the lead 32*a* through a parallel arranged resistor 82 and by-pass capacitor 84. It is to be noted that the load resistor coupled to a source of potential is not provided in the second stage 12 as the source of potential of the battery 72 is coupled to the opposite end of the winding 68. Also, it is to be noted that the first and second stages are capacitively coupled by the capacitor 84 as well as all subsequent stages which stages are omitted for convenience of illustration. The capacitor such as 84 provides a low impedance arrangement to the input trigger pulse on the lead 74, which capacitor may be utilized because of the transient isolating function of the transformer 48. The output signal of the stage 17 is developed by a winding 68*a* of a transformer 48*a* and applied through a lead 74*a* to a subsequent stage (not shown) which may be similar to the second stage 12.

Before further explaining the operation of the counter circuit of FIG. 1, the arrangement of the shift register circuit in accordance with the principles of the invention will be explained by referring to FIG. 2. The shift register circuit which includes first and second stages 94 and 96 may receive binary information in response to a source 98 of serial input pulses or in response to a source 100 of parallel input pulses. The shifting operation occurs in response to shift pulses of a waveform 105 developed by a source of shift pulses 104, which in accordance with the invention may occur either at substantially the same time or after the input informational pulses. The shift register is cleared in response to a clear pulse of a waveform 128 applied to a lead 124 from a source 102 of input pulses in coincidence with a shift pulse of the waveform 105 developed by the source 104.

The first stage 94 includes a delay circuit 110 and a storage element 112 with the delay circuit 110 including a tunnel diode 116 having a cathode coupled to a lead 118 which in turn is coupled through a timing inductor 120 to a suitable source of reference potential such as ground.

The anode of the tunnel diode 116 is coupled to the lead 124 which in turn is coupled to the source 102. The source 102 applies a normally low level voltage to the lead 124 so that the delay circuit 110 is operable and applies a high level voltage pulse to the lead 124 to inhibit triggering of the delay circuit 110 during a clear operation.

The source 98 of serial input information is coupled through a lead 134 and the anode to cathode path of a diode 136 to the lead 118 and the source 100 is coupled through a lead 140 and a diode 142 to the lead 118. The lead 118 is coupled through a coupling capacitor 144 to a first end of a winding 146 of a transformer 148, the other end of the winding 146 being coupled to ground. The capacitor 144 and the winding 146 provide a differentiating action of the pulse of a waveform 119 developed by the delay of current increase through the inductor 120. A second winding 150 of the transformer 148 has a first end coupled to a suitable positive source of potential such as a positive terminal of a battery 152 having a negative terminal coupled to ground. The other end of the winding 150 is coupled through a lead 158 to a parallel connected resistor 160 and coupling capacitor 162 to apply a delayed trigger signal of a waveform 288 (FIG. 5) to a lead 166 of the storage element 112. The lead 166 is coupled through the anode to cathode path of a first tunnel diode 172 to a lead 174 which in turn is coupled through the anode to cathode path of a second tunnel diode 176 to a lead 178. A suitable source of reference potential such as ground is coupled to the lead 178. A series path is also provided including a resistor 180 coupled between the lead 166 and a lead 182 which in turn is coupled through a resistor 184 to the source of reference potential such as ground. A winding 188 of a transformer 190 is coupled between the leads 174 and 182 to provide rapid triggering of the tunnel diodes and to provide an improved output arrangement similar to that of FIG. 1. A second winding 194 of the transformer 190 has a first end coupled to a suitable source of reference potential such as ground and the other end coupled to an output lead 198 for providing serial shifting of binary information between stages. For operating with parallel output terminals, a lead 200 coupled to the lead 174 applies signals through a diode 202 to a suitable storage register, for example.

For the shifting operation, the signals developed on the lead 198 by the storage element 112 are applied to a delay circuit 110*a* and n turn to a storage element 216 of the second stage 96. For convenience of description the elements of the second stage 96 that are similar to those of the first stage 94 have similar numbers except with the designation "*a*" following the number. The serial output of the second stage 96 is applied from the winding 194*a* of the transformer 190*a* to a lead 198*a*. The parallel output signal from the stage 96 may be applied from the lead 174*a* through a lead 200*a* and a diode 202*a* to a suitable utilization device or a storage register, for example.

Referring now to the composite characteristic curves of FIG. 3 as well as to FIG. 1, the operation of the counter circuit in accordance with the invention will be explained in further detail. A curve 230 shows the composite current versus voltage characteristic of the tunnel diode 28 and the resistor 40 connected in parallel with voltage increasing with an arrow 232. The composite characteristic of the tunnel diode 30 and the resistor 42 connected in parallel is shown by a curve 234 having a voltage increasing with an arrow 236. A load line 238 is established by the resistor 60 for the first stage 10 and by the resistor 82 for the second stage 12. The load line 238 is drawn from the B+ voltage having a slope equal to the resistance of the resistors 60 or 82 and the voltage drops through the two tunnel diodes in series such as 28 and 30, which voltage drop is shown at a point 239. The current passed by the resistor and tunnel diode combinations and to which the curve 238 is drawn, is that shown at points 242 and 252. The resistor load line 238 must intersect at the voltage shown at the point 239 with the current shown at the points 242 and 252. Thus, the curves 230 and 238 are drawn relative to the voltage scale of the arrow 232 and the curve 234 is drawn relative to the voltage scale of the arrow 236, all curves having the same current scale.

In operation, a positive reset pulse of the waveform 18 is applied from the reset source 20 to establish the tunnel diodes 28 and 30 respectively in the low voltage and high voltage states of the point 242. In this condition at the point 242, the majority of the current in the storage element 15 flows through the tunnel diode 28, the winding 46 and the resistor 42 as shown by an arrow 29. Thus substantially the same amount of current passes through both parallel combinations of tunnel diodes and resistors. The state of the circuit at the point 242 to which the storage elements 15 and 17 are reset may be considered a binary "0" state. For the first binary count, a positive pulse is applied from the source 14 to the transformer 56 which in turn applies a positive pulse similar to a waveform 246 of FIG. 4 to the lead 32. The tunnel diode 28 is in the low voltage state and the tunnel diode 30 is in the high voltage state when the storage element 15 is in the "0" state. In response to the positive pulse of the waveform 246, the tunnel diode 28 also goes into the high voltage and low current state as the load line 238 is effectively raised to the dotted line 250 as the current increases therethrough. Current is at this time normally flowing in the path of the arrow 29. Also, smaller currents are flowing through the tunnel diode 30 and through the resistor 40 which currents are substantially equal in magnitude. When the tunnel diode 28 changes to the high voltage state, the current flowing therethrough decreases. To maintain current flow as required by the energy stored in the inductance of the winding 46, current thus flows from the capacitance of the tunnel diode 30. As the energy stored in the winding 46 is dissipated, the voltage falls on the lead 34 and the tunnel diode 30 is triggered to the low voltage state. Substantially at the same time or shortly thereafter, a principal current path of an arrow 31 is established from the lead 32, through the resistor 40, the winding 46 and the tunnel diode 30 to ground to provide a stable binary state with the tunnel diodes and resistors in parallel having composite characteristics at the point 252. The bistable element is thus in a binary "1" condition. When the votlage on the lead 34 falls as shown by a waveform 260 of FIG. 4, a negative pulse of the waveform 278 representing an interrogated "0" is developed in the winding 68 and applied to the lead 74 but does not trigger the bistable element 17. The two stages of the counter thus retain a "10" binary number.

In response to the next positive pulse applied from the source 14, the increased current flowing through the tunnel diode 30 changes the state of that tunnel diode to a high voltage and low current state so that both the tunnel diodes 28 and 30 are temporarily in the high voltage states. The energy stored in the winding 46 thus flows into the diode 28 to charge the capacitance thereof. As the voltage rises on the lead 34 to the zero state, the diode 28 is triggered to the low voltage state and the principal steady current flows through the path of the arrow 29. Thus the operating point of the storage element 15 relative to the composite curve of the tunnel diode 28 and the resistor 40 and the composite curve of the tunnel diode 30 and the resistor 44 is established at the point 242 of FIG. 3. As a result of this rise of voltage on the lead 34 as shown by the waveform 260 of FIG. 4, a positive pulse of the waveform 278 is applied to the lead 74 and the storage element 17 is triggered to the "1" state of the point 252 of FIG. 3 with the tunnel diode **28*a* in the high voltage state and the tunnel diode 30*a*** in the low voltage state. The two stages of the counter are thus storing a binary number "01."

In a similar manner, the following positive pulse from the source 14 triggers the storage element 15 to the "1" state at the point 252 to develop a negative pulse of the waveform 278 on the lead 74. Thus, the storage element 17 remains in the binary "1" state at the point 252 and a pulse is not applied to a third stage (not shown). It is to be noted that the trigger pulses for each stage occur at twice the rate of the output pulses from that stage which in turn trigger the subsequent stage.

Figure 3:
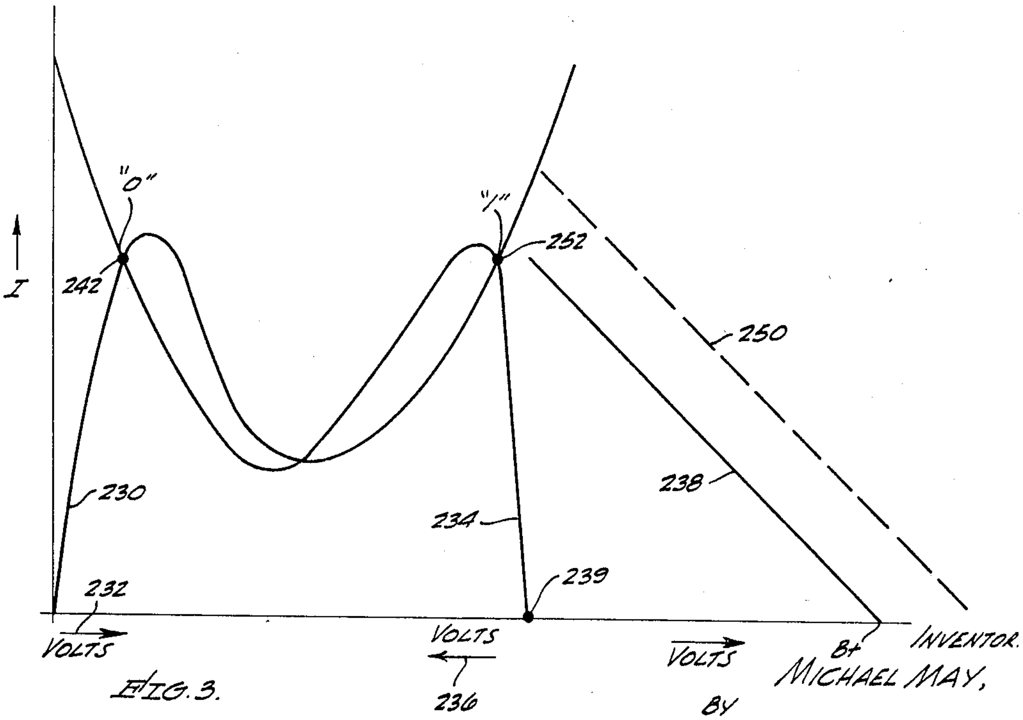
FIG. 3 is a graph of current versus voltage showing a composite characteristics of the tunnel diodes and parallel resistors utilized in the storage elements of FIGS. 1 and 2.
Figure 4:
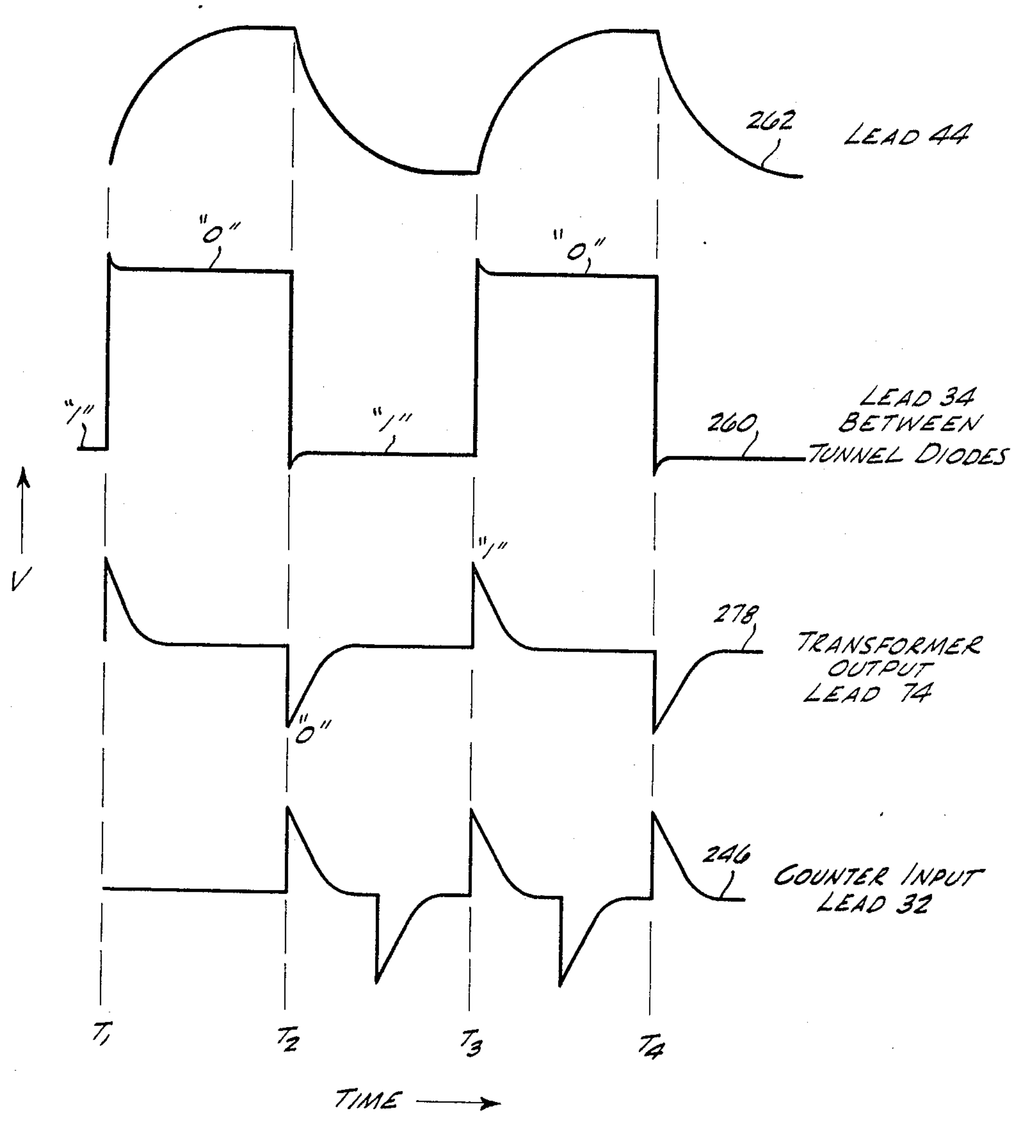
FIG. 4 is a schematic diagram of voltage waveforms as a function of time for further explaining the operation of the counter circuit of FIG. 1.

Referring now principally to FIG. 4 as well as to FIGS. 1 and 3, the operation of the counter will be explained in further detail in accordance with the principles of the invention. When the storage element 15 is in the "0" or clear state, the tunnel diode 30 is in the high voltage state and the voltage on the lead 34 is at a high level as shown by the waveform 260. At the same time, the voltage at the lead 44 is at a high level as shown by a waveform 262. Also, when the tunnel diode 28 is in the high voltage state with the storage element 15 in the "1" state, the voltage on the lead 34 is at the low level of the waveform 260. At the same time, when the storage element 15 is in the "1" state, the voltage on the lead 44 is at a relatively low level as shown by the waveform 262. At a time $T_1$, the storage elements 15 and 17 are triggered to the reset or "0" state in response to a positive pulse of the waveform 18 (FIG. 1) so as to be in the state of the point 242 of the composite characteristic curves of FIG. 3. The voltage on the lead 34 rises to the high level of the waveform 260. Because the reset pulse of the waveform 18 is applied to all stages, the positive pulse of the waveform 278 does not affect the subsequent storage element 17. The reset pulse of the waveform 18 is of a sufficient time width so that transients which may affect subsequent stages are terminated during the period thereof. At a time $T_2$, a positive pulse similar to that of the waveform 246 is applied to the lead 32 and the tunnel diodes 28 and 30 are respectively triggered to the high and low voltage states so that the voltage on the lead 34 falls to the lower level of the waveform 260. The voltage on the lead 44 falls at a slower rate as shown by the waveform 262. Also at time $T_2$, in response to the pulse of the waveform 260 a negative pulse of the waveform 278 is applied to the lead 74 and to the subsequent stage 12 but without changing the state of the storage element such as 17.

At a time $T_3$, a positive pulse similar to that of the waveform 246 is applied to the lead 32 and the storage element 15 changes state to the point 242 of FIG. 3. A positive pulse of the waveform 278 is developed on the lead 74 and is applied to the storage element 12 to change the state thereof. It is to be noted that the stored binary count only changes in response to a positive pulse developed by the source 14 or by the previous stage. The waveform 246 which has positive and negative pulses is shown to illustrate that the frequency of pulses applied to any selected stage from a previous stage is twice that of the pulses such as those of the waveform 278 developed by the selected stage. Thus, the negative pulses of the waveform 246 are shown to illustrate that a preceding stage in the counter develops negative pulses that do not trigger the subsequent stage and develops positive pulses at twice the rate of the trigger pulses applied to the subsequent stage. The counter operation continues in a similar manner to provide a binary count having a maximum value determined by the number of stages that are provided such as 10 and 12. It is to be noted that the stored count of the counter of FIG. 1 may be derived or sampled from the leads 34 and **34*a* by sensing the levels of the waveform 260** through leads (not shown) connected thereto.

Figure 2:
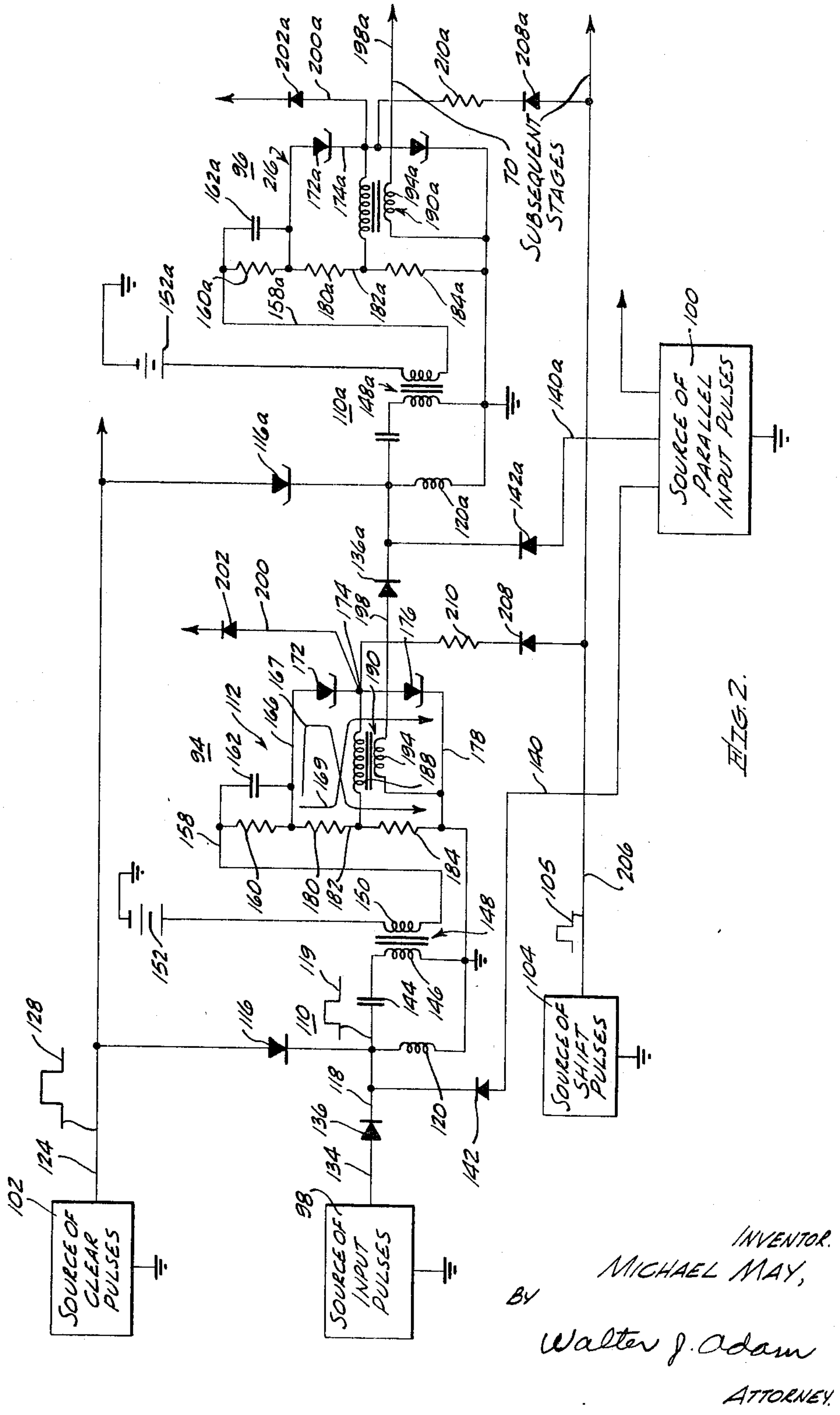
FIG. 2 is a schematic circuit and block diagram of an improved shift register circuit including storage elements and delay elements in accordance with the principles of the invention.

Referring now to FIGS. 2 and 3 the operation of the shift register circuit in accordance with the invention will be explained in further detail. In general, the shift register is first cleared so that all storage elements are in the state of the point 242 of FIG. 3, and binary information is either sequentially recorded in the first stage 94 in a serial manner from the serial input source 98 or recorded in all stages in parallel from the parallel input source 100. It is to be noted that the points 242 and 252 of FIG. 3 represent the stable operating conditions of the storage elements 112 and 216 similar to the storage elements of FIG. 1. When operating as a serial shift register, a shift pulse is applied to the stages 94 and 96 after each recording operation. If the register is filled with information from the parallel input source 100, a continuous train of shift pulses may be applied to shift the information through the stages such as 94 and 96.

In order to allow information to be interrogated at each stage in response to the shift pulse, and to allow the information to be then recorded in the subsequent stage, delay circuits such as 110 and **110*a* provide a suitable delay period. In response to a positive input pulse applied to the lead 134, the current flowing through the tunnel diode 116**, which is normally in a high voltage and low current state, decreases so that the tunnel diode is triggering to the low voltage state. The delay period is provided by the time required to increase the current through the inductor 120 until the tunnel diode 116 triggers at its peak current back to the high voltage state. The pulse of the waveform 119 represents the time delay provided before the tunnel diode 116 is triggered back to the high voltage state. The pulse of the waveform 119 is differentiated by the action of the capacitor 144 and the winding 146 and applied to the lead 158 as a negative and positive pulse of the waveform 288 of FIG. 5.

For clearing the shift register, the positive pulse of the waveform 128 is applied from the source 102 to the lead 124 to increase the current through the tunnel diodes such as 116 and 116*a* when a shift pulse is applied to the binary storage elements such as 112 and 216. Thus the delay circuits such as 110*a* and 110 if a pulse is applied from the source 98, are not triggered to the low voltage stage when a shift pulse from the source 104 interrogates each of the storage elements such as 112 and 216. As a result, all of the storage elements remain in the reset or "0" state of the point 242 of FIG. 3.

Figure 5:
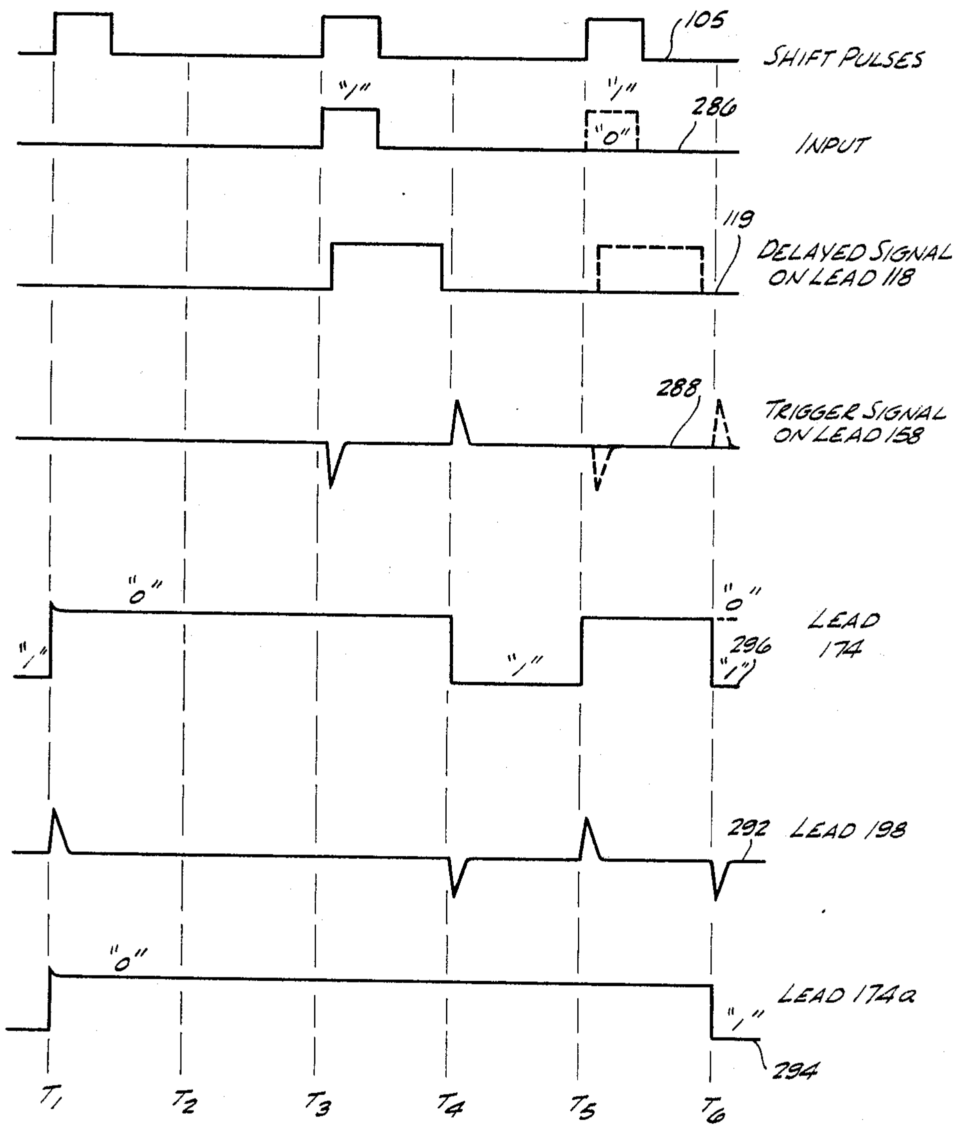
FIG. 5 is a schematic diagram of voltage waveforms as a function of time for further explaining the operation of the shift register circuit of FIG. 2.

Referring now also to FIG. 5, a shift pulse of the waveform 105 is applied to the lead 206 at a time $T_1$. Also at the time $T_1$, a clear pulse of the waveform 128 (FIG. 2) is applied to the lead 124 to inhibit the triggering of the tunnel diode 116. In response to the shift pulse of the waveform 105, the tunnel diode 176 may be triggered to the high voltage state assuming that the storage element 112 is previously storing a "1" at the point 252 of FIG. 3. With current flowing in the path of an arrow 169 when the storage element is in the "1" state, current is applied to the capacitance of the tunnel diode 176 and the current path reverses as shown by an arrow 167 with the tunnel diode 172 going to the low voltage state. As shown by a waveform 296, the voltage rises on the lead 174 at time $T_1$ to apply the pulse of a waveform 292 to the lead 198. Because the delay circuit 110*a* is inhibited by the clear pulse, the tunnel diode 116*a* is not triggered by the positive pulse of the waveform 292. As shown by a waveform 294, the voltage at the lead 174*a* also rises as the second stage 96 is cleared to a "0" state. At time $T_2$, the "0" states of the storage elements 112 and 216 are not disturbed as delayed pulses of the waveforms 119 and 288 are not formed by the delay circuits.

After all storage elements such as 112 and 216 are cleared, the shift pulse of the waveform 105 may be applied to the lead 206 at a time $T_3$. In response to the shift pulse of the waveform 105, the storage elements remain in the "0" state. Also at time $T_3$, the input pulse of a waveform 286 representing a binary "1" is applied to the lead 134 to trigger the tunnel diode 116 to the low voltage state. As the result, a delayed pulse of the waveform 119 is developed on the lead 118 with a negative spike of the waveform 288 being applied to the lead 166 but having substantially no effect on the storage element 112. After the delay period at time $T_4$, the pulse of the waveform 119 terminates and a positive trigger pulse of the waveform 288 is applied to the leads 158 and 166. As a result, the tunnel diodes 172 and 176 are triggered to respective high and low voltage states and a negative pulse of the waveform 292 developed in response to the change of level of the waveform 296 is applied to the delay circuit 110*a*, which circuit is not triggered thereby. Also at time $T_4$ the principal current path of the storage element 112 changes from that of the arrow 167 to the arrow 169 as the energy of the winding 188 is dissipated.

At a time $T_5$, a shift pulse of the waveform 105 is applied to the load 206 to interrogate the "1" stored in the storage element 112 and the "0" sored in the storage element 216. As a result, the tunnel diode 176 goes to a high voltage state so that the voltage rises on the lead 174 as shown by the waveform 296 and a positive pulse of the waveform 292 is applied to the lead 198. As a result, the tunnel diode 116*a* is triggered to the low voltage state and a delayed pulse is applied to the lead 158*a*. Also at time $T_5$ or at an earlier time, an input signal of the waveform 286 is applied to the lead 134 and may have a positive value shown dotted to represent a "1" or be at the low level representing a "0." As a result, the tunnel diode 116 is triggered to the low voltage state if a positive pulse is applied to the lead 118 or remains in the high voltage state in response to the absence of a pulse.

At time $T_6$ when the delay time of the waveform 119 is terminated, assuming a "1" pulse shown dotted in the waveform 286 was applied to the delay circuit 110 at time $T_5$, a positive trigger pulse of the waveform 288, which is shown dotted, is applied to trigger the storage element 112 to the "1" state of point 252 of FIG. 3. As a result, a negative pulse of the waveform 292 is applied to the lead 198 without affecting the delay circuit 110*a*. If a low level signal shown solid in the waveform 286 was applied to the delay circuit 110 at time $T_5$, the storage element 112 remains in the "0" state at time $T_6$ and the negative pulse of the waveform 292 is not applied to the storage element 118*a* at that time. Thus, at time $T_6$ if a pulse of the waveform 286 representing a binary "1" was applied to the lead 134 at time $T_5$, the voltage of the waveform 296 changes to the lower level and if a pulse was not applied to the lead 134 at time $T_5$, the voltage of the waveform 296 remains at the upper level.

Also at time $T_6$ in response to a delayed pulse on the lead 118*a* resulting from the positive trigger pulse of the waveform 292 on the lead 198 at time $T_5$, the storage element 216 is triggered to the "1" state as shown by the waveform 294. This operation continues in a similar manner with each stage when storing a binary "1" applying a positive pulse to the delay circuit of the next stage in response to the shift pulse of the waveform 105 and, when storing a "0," applying substantially no signal to the following stage in response to the shift pulse of the waveform 105. Thus, each stage is cleared by shift pulses of the waveform 105 and the interrogation signal is applied to the delay circuit of the following stage for triggering that stage before the next clear pulse if the interrogated stage was in a "1" state.

For operating with parallel input signals from the source 100 the stages such as 94 and 96, after being cleared, may be triggered to selected binary conditions and the information may be then periodically shifted from stage to stage in response to the shift pulse of the waveform 105. If it is desired to read the information stored in the shift register in parallel, the states of the storage elements such as 112 and 216 may be sensed or sampled on the respective leads 200 and 200*a* having levels shown by the waveforms 296 and 294. It is to be noted that although the counter and the shift register circuits are shown having only two stages for convenience of illustration, a plurality of stages may be utilized for each circuit in accordance with the principles of the invention. The output signal or stored count of the counter circuit may be sensed by sampling the voltages between the tunnel diodes of each stage such as that of the waveform 260 of FIG. 4 at any time during the operation after transients have terminated. The last stage of the shift register circuit of FIG. 2 may apply the interrogated signals from a lead such as 200*a* to a suitable utilization device, for example.

The counter and shift register arrangements in accordance with the principles of the invention are effectively capacitively coupled at the input by the capacitors such as 84, 162 and 162*a*. Thus, substantially none of the amplitude of the signal developed by the previous stage is decreased by current flowing through a load resistor resulting in highly reliable transfer of informational signals. The transformer arrangement such as the transformer 48 of FIG. 1 has a turns ratio that prevents transient signals from substantially affecting a previous stage, thus allowing capacitive coupling to be utilized. The output signal from each stage has a low impedance because of the winding such as 68 of the transformer 48 and the winding 194 of the transformer 190. Because of this low output impedance, a relatively high power signal is applied to the subsequent stage because of the impedance match to that subsequent stage. Another advantage of the arrangement in accordance with the invention is that the transformer of the storage element such as the transformer 48 or 190 may have any desired turns ratio as is required for impedance matching.

Thus there has been described an improved binary storage element that provides reliable operation between stages without the necessity of separate amplifier arrangements. The storage elements have their input terminals effectively capacitively coupled to the output of the preceding stage and the output of each stage has a selected impedance which may be relatively low. The counter and shift register circuits in accordance with the invention which apply relatively high level signals to subsequent stages, provide reliable operation because they may be designed to operate over wide ranges of parameter variations. The shift register circuit in accordance with the invention provides reliable operation either with serial or parallel input signals and either with serial or parallel output terminals. The shift register circuit may operate with the input informational signals synchronized in time with the source of shift pulses or timing control signals.

What is claimed is:

1. A bistable element responsive to first and second sources of input pulses comprising
   first and second negative resistance means coupled in series across said first source of pulses,
   first and second impedance means coupled in series across said first source of pulses,
   means coupling said second source of pulses to a point between said first and second tunnel diodes,
   means intercoupling said first and second sources of pulses,
   a transformer having first and second windings with the first winding coupled from a point between said first and second impedance means to a point between said first and second tunnel diodes,
   and output means coupled to said second winding.

2. A binary storage element comprising
   a source of input pulses,
   a source of reset pulses,
   a first resistor coupled to said source of input pulses,
   a second resistor coupled between said first resistor and said source of input pulses,
   a first tunnel diode having an anode and a cathode with the anode coupled to said source of input pulses,
   a second tunnel diode having an anode and a cathode with the anode coupled to the cathode of said first tunnel diode and the cathode coupled to said source of input pulses,
   a transformer having first and second windings with the first winding coupled from a point between the first and second resistors to a point between the cathode and anode of the respective first and second tunnel diodes, the first end of said second winding coupled to said source of input pulses,
   output means coupled to the second end of said second winding,
   and means intercoupling said source of reset pulses and said point between the cathode and anode of the respective first and second tunnel diodes.

3. A counter having a plurality of sequential stages each including a first and a second terminal comprising
   first and second tunnel diodes in each stage coupled in series between the first and second terminals of the corresponding stage,
   first and second impedance means in each stage coupled in series between the first and second terminals of the corresponding stage,
   a transformer having first and second windings in each stage with the first winding coupled from a point between the first and second tunnel diodes of the corresponding stage to a point between the first and second impedance means of that stage,
   a source of input pulses coupled to the first terminal of a selected stage,
   means intercoupling the second winding of the transformer of each stage having a subsequent stage in the sequence, to the first terminal of the subsequent stage,
   a source of reset pulses coupled to said point between said first and second tunnel diodes of each stage,
   and means coupling said source of input pulses, said source of reset pulses and the second terminal of each stage.

4. A counter circuit having a plurality of sequential stages each including a first and a second terminal comprising
   first and second tunnel diodes in each stage coupled in series between the first and second terminals of the corresponding stage,
   first and second resistors in each stage coupled in series between the first and second terminals of the corresponding stage,
   a transformer having first and second windings in each stage with the first winding coupled from a point between the first and second tunnel diodes of the corresponding stage to a point between the first and second resistors of that stage,
   a source of input pulses coupled to the first terminal of a first stage of the sequence of stages,
   a source of potential coupled to a first end of the second winding of each stage,
   a capacitor coupled between a second end of the second winding of each stage except the last stage of said sequence, and the first terminal of the subsequent stage,
   a source of reset pulses coupled to said point between said first and second tunnel diodes of each stage,
   and means intercoupling said source of input pulses, the second terminal of each stage, said source of potential and said source of reset pulses.

5. A shift register having a plurality of sequential stages each including a first and a second terminal comprising
   first and second tunnel diodes in each stage coupled in series between the first and second terminals of the corresponding stage,
   first and second impedance means in each stage coupled in series between the first and second terminals of the corresponding stage,
   transformer means in each stage coupled from a point between the first and second tunnel diodes of the corresponding stage to a point between the first and second impedance means of that stage,
   a source of input pulses,
   a delay circuit in each stage with the delay circuit of a first stage of the sequence coupled between said source of input pulses and the first terminal of said first stage and the delay circuits of the subsequent stages coupled between the first terminal of the corresponding stage and the transformer means of the preceding stage,
   a source of shift pulses coupled to said point between said first and second tunnel diodes of each stage,
   and means intercoupling said source of input pulses, said source of shift pulses and the second terminal of each stage.

6. A binary shift register circuit having a plurality of sequential stages each including first and second terminals comprising
   first and second tunnel diodes in each stage coupled in series between the first and second terminals of the corresponding stage,
   first and second resistors in each stage coupled in series between the first and second terminals of the corresponding stage, a transformer in each stage having first and second windings with the first winding coupled from a point between the first and second tunnel diodes of the corresponding stage to a point between the first and second resistors of that stage and with a first end of said second winding coupled to the second terminal of the corresponding stage, a source of serial input pulses, a delay circuit in each stage coupled in a first stage of the sequence between said source of input pulses and the first terminal of said first stage, and coupled in the other stages of said sequence to the first terminal of the corresponding stage and to a second end of said second winding of the preceding stage, a source of shift pulses coupled to said point between said first and second tunnel diodes of each stage, and means coupling said source of input pulses, said source of shift pulses and the second terminal of each stage in common.

References Cited by the Examiner

UNITED STATES PATENTS

| | | | |
|---|---|---|---|
| 3,116,424 | 12/1963 | Kaenel | 307—88.5 |
| 3,116,425 | 12/1963 | Kaenel | 307—88.5 |
| 3,131,313 | 4/1964 | Habayeb | 307—88.5 |
| 3,178,700 | 4/1965 | Kaenel | 307—88.5 |

OTHER REFERENCES

G.E. Tunnel Diode Manual, Chaye, pages 54 and 55, Mar. 20, 1961.

ARTHUR GAUSS, *Primary Examiner.*

J. S. HEYMAN, *Assistant Examiner.*